US012588147B2

(12) United States Patent
Nguyen et al.

(10) Patent No.: US 12,588,147 B2
(45) Date of Patent: Mar. 24, 2026

(54) FILLING CRACKS ON A SUBSTRATE VIA

(71) Applicant: Micron Technology, Inc., Boise, ID (US)

(72) Inventors: Quang Nguyen, Boise, ID (US); Christopher Glancey, Boise, ID (US); Koustav Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 215 days.

(21) Appl. No.: 18/379,371

(22) Filed: Oct. 12, 2023

(65) Prior Publication Data

US 2024/0155767 A1 May 9, 2024

Related U.S. Application Data

(60) Provisional application No. 63/423,910, filed on Nov. 9, 2022.

(51) Int. Cl.
| | |
|---|---|
| *H05K 1/11* | (2006.01) |
| *H01L 23/00* | (2006.01) |
| *H05K 3/40* | (2006.01) |
| *H10W 90/00* | (2026.01) |

(52) U.S. Cl.
CPC ........... *H05K 1/116* (2013.01); *H05K 3/4038* (2013.01); *H05K 2201/0939* (2013.01); *H05K 2201/09563* (2013.01); *H05K 2201/10674* (2013.01); *H05K 2201/10984* (2013.01); *H05K 2203/1105* (2013.01); *H10W 90/724* (2026.01)

(58) Field of Classification Search
None
See application file for complete search history.

(56) References Cited

U.S. PATENT DOCUMENTS

| | | | | |
|---|---|---|---|---|
| 5,401,913 A * | 3/1995 | Gerber | ................. | H05K 3/4617 |
| | | | | 174/262 |
| 8,308,053 B2 * | 11/2012 | Farnworth | ............ | H01L 23/488 |
| | | | | 228/244 |
| 8,671,560 B2 * | 3/2014 | Conn | .................. | H01L 23/5384 |
| | | | | 29/842 |
| 9,905,524 B2 * | 2/2018 | Chuang | .................. | H01L 24/13 |
| 11,127,899 B2 * | 9/2021 | Greenlee | .............. | G11C 13/004 |

(Continued)

FOREIGN PATENT DOCUMENTS

JP        2002118362 A  *  4/2002

OTHER PUBLICATIONS

JP-2002118362-A translation from FIT database (Year: 2025).*

*Primary Examiner* — Thomas J Hong
*Assistant Examiner* — Joshua D Anderson
(74) *Attorney, Agent, or Firm* — Dorsey & Whitney LLP

(57) ABSTRACT

A semiconductor device assembly is provided. The assembly includes a substrate having a first layer with a first contact and a second layer with a second contact. A via that includes a first conductive material electrically couples the first contact and the second contact. A second conductive material having a lower melting point than the first conductive material is disposed at least partially between the via and the second contact. When a crack occurs between the via and the second contact, the second conductive material may be heated to fill the crack. Thus, the techniques, apparatuses, and systems disclosed herein may provide a repairable substrate.

10 Claims, 8 Drawing Sheets

(56) References Cited

U.S. PATENT DOCUMENTS

| | | | | | |
|---|---|---|---|---|---|
| 11,276,659 | B2* | 3/2022 | Arifeen | .................. | H01L 24/81 |
| 2023/0197659 | A1* | 6/2023 | Ayalasomayajula | .... | H01L 24/16 |
| | | | | | 257/69 |
| 2024/0234278 | A9* | 7/2024 | Murayama | ........... | H05K 3/3436 |
| 2024/0237557 | A1* | 7/2024 | Nakamura | ............. | H10N 60/12 |

* cited by examiner

500

504

502

506

600

504

602

502

506

1100

1200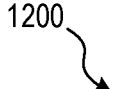

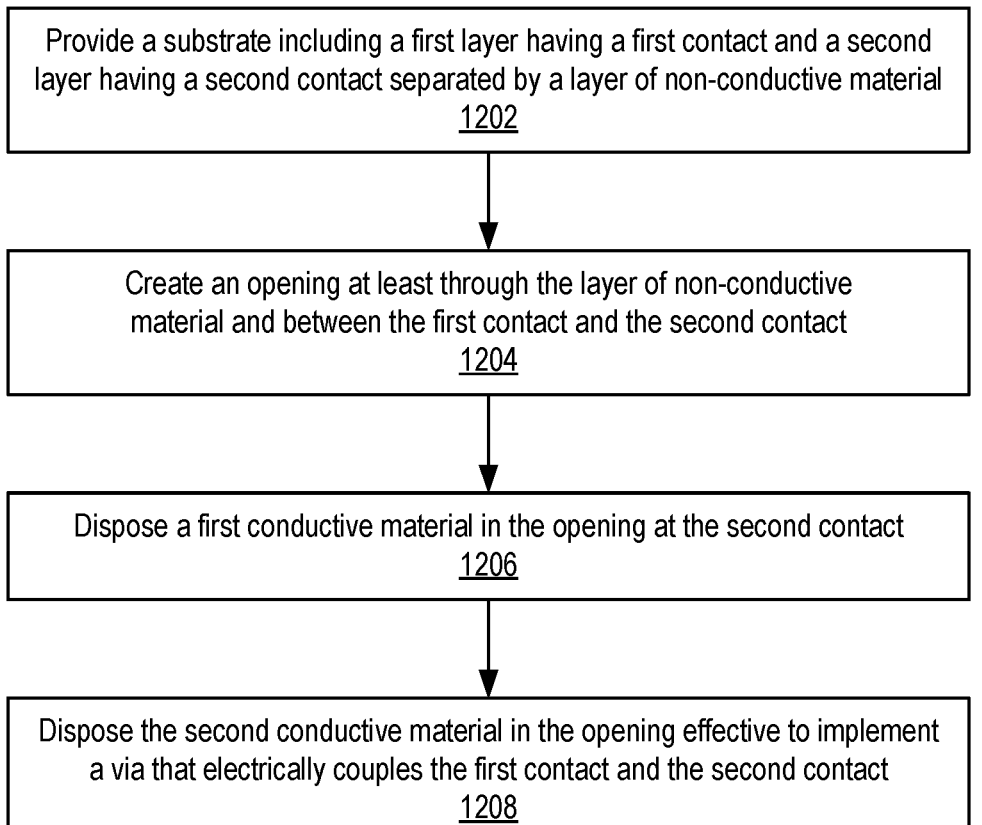

Provide a substrate including a first layer having a first contact and a second
layer having a second contact separated by a layer of non-conductive material
1202

Create an opening at least through the layer of non-conductive
material and between the first contact and the second contact
1204

Dispose a first conductive material in the opening at the second contact
1206

Dispose the second conductive material in the opening effective to implement
a via that electrically couples the first contact and the second contact
1208

*FIG. 12*

1300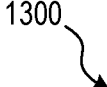

| |
|---|
| Provide a substrate including a first layer having a first contact, a second layer having a second contact, a via electrically coupling the first contact and the second contact, and a second conductive material disposed at least partially between the via and the second contact<br>1302 |

| |
|---|
| Heat the second conductive material to a temperature that is higher than the second melting point but lower than the first melting point<br>1304 |

*FIG. 13*

FILLING CRACKS ON A SUBSTRATE VIA

CROSS-REFERENCE TO RELATED APPLICATION(S)

The present application claims priority to U.S. Provisional Patent Application No. 63/423,910, filed Nov. 9, 2022, the disclosure of which is incorporated herein by reference in its entirety.

TECHNICAL FIELD

The present disclosure generally relates to semiconductor device assemblies, and more particularly relates to filling cracks on a substrate via.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals and encapsulating the dies to protect them from environmental factors (e.g., moisture, particulates, static electricity, and physical impact). The package can include a package-level substrate that has routing circuitry (e.g., traces, lines, vias, and other connective structures) to enable electrical signals to pass between the semiconductor dies and any external components.

BRIEF DESCRIPTION OF THE DRAWINGS

FIG. 12 illustrates a method of making a substrate in accordance with an embodiment of the present technology.

FIG. 13 illustrates a method of repairing a substrate in accordance with an embodiment of the present technology.

DETAILED DESCRIPTION

Semiconductor devices are integrated in many devices to implement memory cells, processor circuits, imager devices, and other functional features. As more applications for semiconductor devices are discovered, designers are tasked with creating improved devices that can perform a greater number of operations per second, store greater amounts of data, or be more robust, without materially increasing the size of the semiconductor device. One technique is to implement multiple circuit components within a single package. The packaged semiconductor device may include a substrate on which the multiple circuit components are implemented. The substrate may provide multiple layers of routing circuitry to enable electrical signals to be passed between the packaged semiconductor device and any other component. Vias may be implemented between the multiple layers to create conductive paths for the electrical signals to travel along. One such substrate is illustrated by way of example in FIG. 1.

Figure 1:
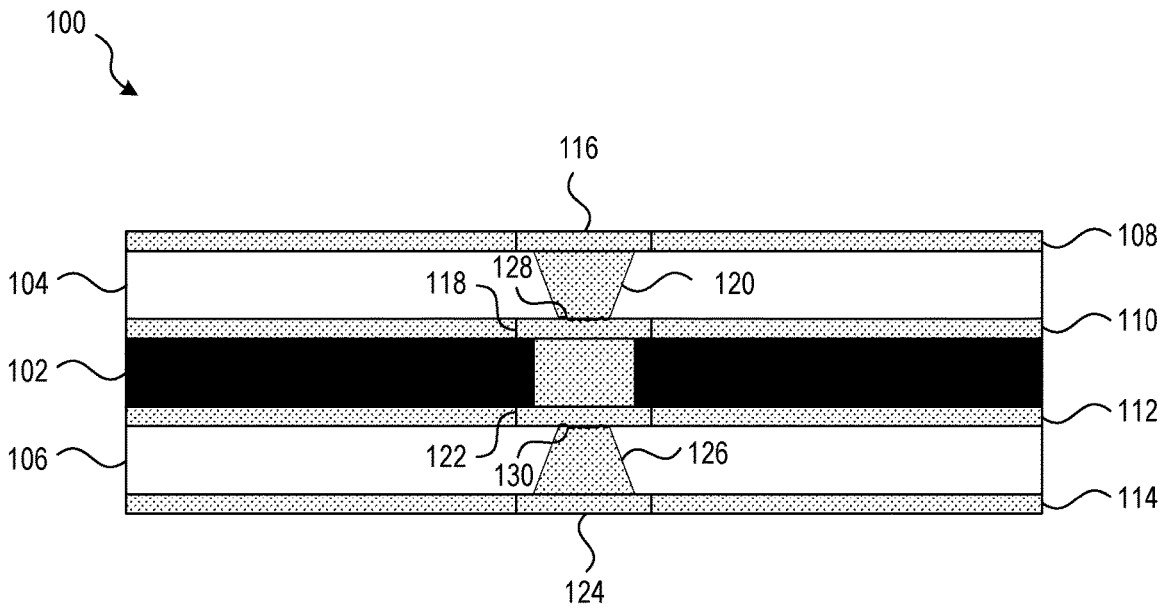
FIG. 1 illustrates a simplified schematic cross-sectional view of an example substrate.

As can be seen with reference to FIG. 1, a substrate 100 (e.g., printed circuit board (PCB)) is provided which includes multiple layers. The substrate 100 includes a core layer 102 with laminated layers (e.g., composed of insulating material such as pre-preg) thereon. Specifically, a laminated layer 104 may be disposed above the core layer 102, and a laminated layer 106 may be disposed below the core layer 102. Metallization layers (e.g., metallization layer 108, metallization layer 110, metallization layer 112, and metallization layer 114) may be disposed at each side of the various layers to implement routing circuitry (e.g., conductive traces). The routing circuitry may transport electrical signals between various circuit components at or connected to the substrate 100. Vias may be implemented between the layers to enable electrical signals to be carried between the various layers. For example, metallization layer 108 may include a contact 116, metallization layer 110 may include a contact 118, and a via 120 may be implemented between the contact 116 and the contact 118. Similarly, metallization layer 112 may include a contact 122, metallization layer 114 may include a contact 124, and a via 126 may be implemented between the contact 122 and the contact 124. Various circuitry (e.g., traces, lines, wires, and other connection elements) may connect to the contacts to electrically couple the circuitry with the vias. As a result, electrical signals may be transmitted between the various layers along the vias.

The via 120 and the via 126 may be implemented by creating an opening through the laminated layer 104 and the laminated layer 106 and plating a conductive material (e.g., copper, gold, silver, tin, aluminum, or an alloy of these materials) at the opening. The opening may be treated with plasma to remove substrate residue from the opening and provide a clean surface for plating the conductive material. After cleaning, the conductive material may be plated along the surfaces defining the opening to form a conductive path for electrical signals to be transported along. The conductive material may then be used to fill the opening and form a filled via. In some implementations, the plating of conductive material may have certain weaknesses that can impact the reliability of the substrate 100. For example, the cleaning process may fail to remove the substrate residue, and the conductive material may be plated on an uneven surface that has varying thermal properties. Thus, during thermal cycling, the conductive material may expand and contract, creating cracks that at least partially separate the vias and the contacts. For example, the crack 128 may occur at the via 120, and the crack 130 may occur at the via 126. These cracks may increase the resistance between the vias and the contacts and impact the ability of electrical signals to be carried therebetween. As a result, the substrate 100 may be unreliable in some applications.

To address these drawbacks and others, various embodiments of the present application provide semiconductor device assemblies that include a substrate capable of filling a crack in a via. The substrate includes a first layer with a first contact and a second layer with a second contact. A via that includes a first conductive material electrically couples the first contact and the second contact. A second conductive material having a lower melting point than the first conductive material is disposed at least partially between the via and the second contact. When a crack occurs between the via and the second contact, the second conductive material may be heated to fill the crack. Thus, the techniques, apparatuses, and systems disclosed herein may provide a repairable substrate.

Figure 2:
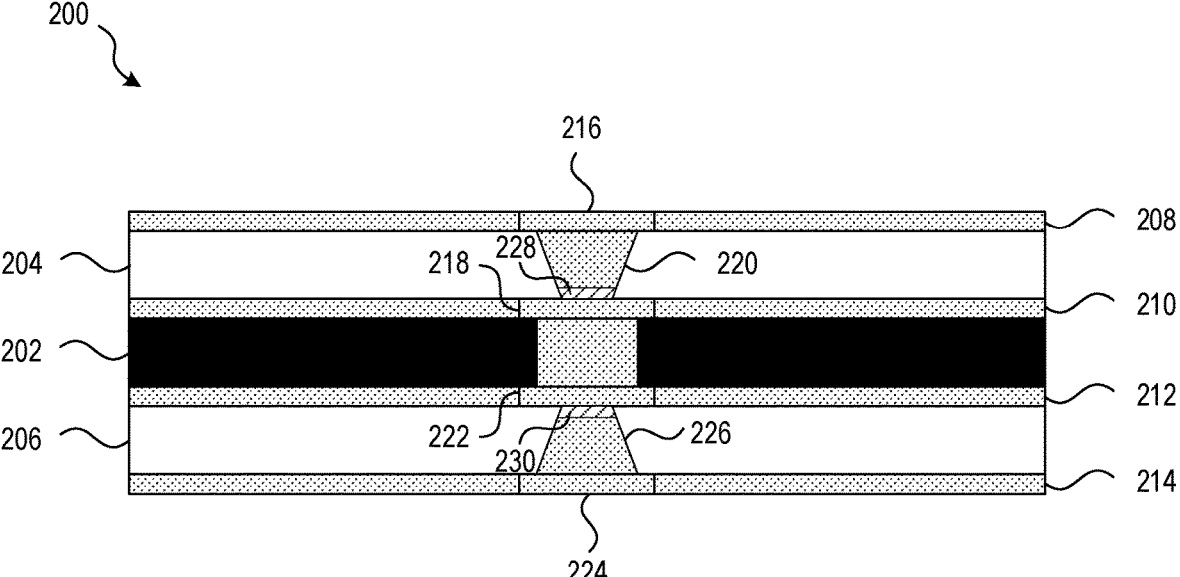
FIG. 2 illustrates a simplified schematic cross-sectional view of a substrate in accordance with an embodiment of the present technology.

FIG. 2 illustrates a simplified schematic cross-sectional view of a substrate 200 in accordance with an embodiment of the present technology. As can be seen with reference to FIG. 2, substrate 200 includes a core layer 202, a laminated layer 204 (e.g., composed of an insulating material such as pre-preg), and a laminated layer 206. Circuitry is disposed at the metallization layer 208, the metallization layer 210, the metallization layer 212, and the metallization layer 214 between the various layers in the substrate 200. The metallization layers may include contacts (e.g., contact 216, contact 218, contact 222, and contact 224), which may connect to circuitry (e.g., traces, lines, wires, and other connection elements) at the metallization layers. Vias (e.g., via 220 and via 226) may be implemented between the contacts to enable electrical signals to be carried between the various layers of the substrate 200. The vias (e.g., microvias, blind vias, buried vias, through vias, etc.) may include a conductive material, for example, copper, that provides a conductive path for electrical signals to be carried along. In aspects, a conductive material (e.g., solder, low-temperature solder, solder paste, etc.) having a lower melting point (e.g., 100 to 150 degrees Celsius) than the conductive material used to implement the vias may be disposed at least partially between the vias and the respective contact. Specifically, conductive material 228 may be disposed at least partially between the via 220 and the contact 218, and the conductive material 230 may be disposed at least partially between the via 226 and the contact 222. In this way, the via 220 may electrically couple the contact 216 and the contact 218 through the conductive material 228. Similarly, the via 226 may electrically couple the contact 224 and the contact 222 through the conductive material 230.

Figure 3:
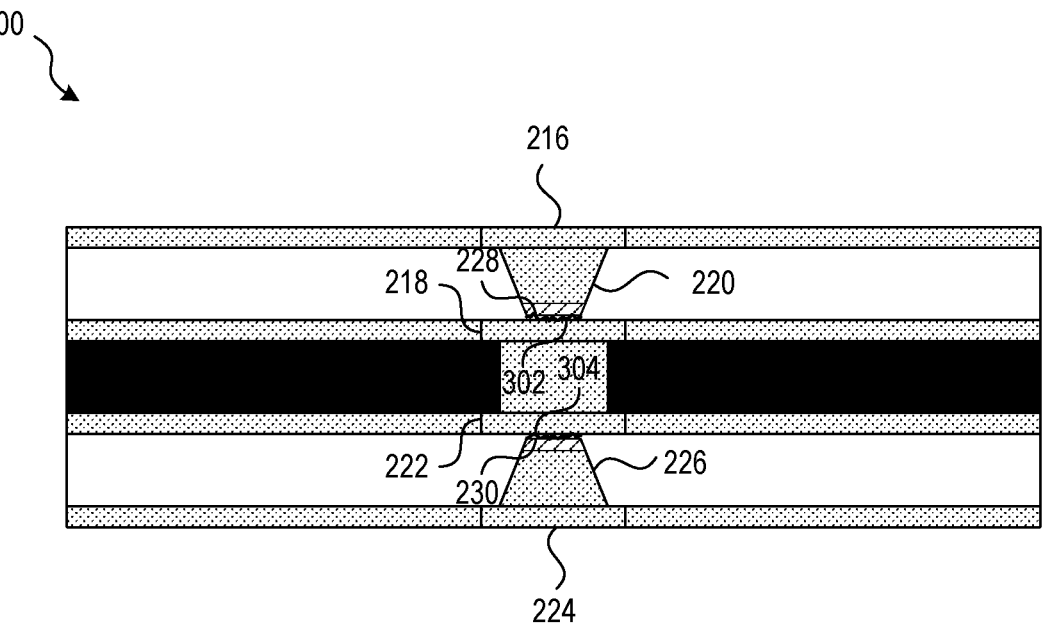
FIG. 3 illustrates a simplified schematic cross-sectional view of a substrate in accordance with an embodiment of the present technology.

FIG. 3 illustrates a simplified schematic cross-sectional view of a substrate 300 in accordance with an embodiment of the present technology. The substrate 300 may correspond to the substrate 200 of FIG. 2; however, cracks may occur between the vias and the respective contact. Specifically, the crack 302 at least partially separates the via 220 from the contact 218, and the crack 304 at least partially separates the via 226 from the contact 222. In aspects, the cracks may occur at a joint between the via or the conductive material (e.g., the conductive material 228 or the conductive material 230) and the contact. The cracks may increase the resistance between the via and the contact, thereby impacting the reliability of the substrate 300 to transport electrical signaling through the via. To repair the crack, the conductive material 228 and the conductive material 230 may be heated (e.g., by oven baking the substrate 300) to a temperature effective to melt the conductive material 228 and the conductive material 230 but not the conductive material implementing the vias. As a result, the conductive material 228 and the conductive material 230 may flow into and fill the crack 302 and the crack 304, respectively, without melting the conductive material implementing the vias. The resulting substrate is illustrated by way of example in FIG. 4.

Figure 4:
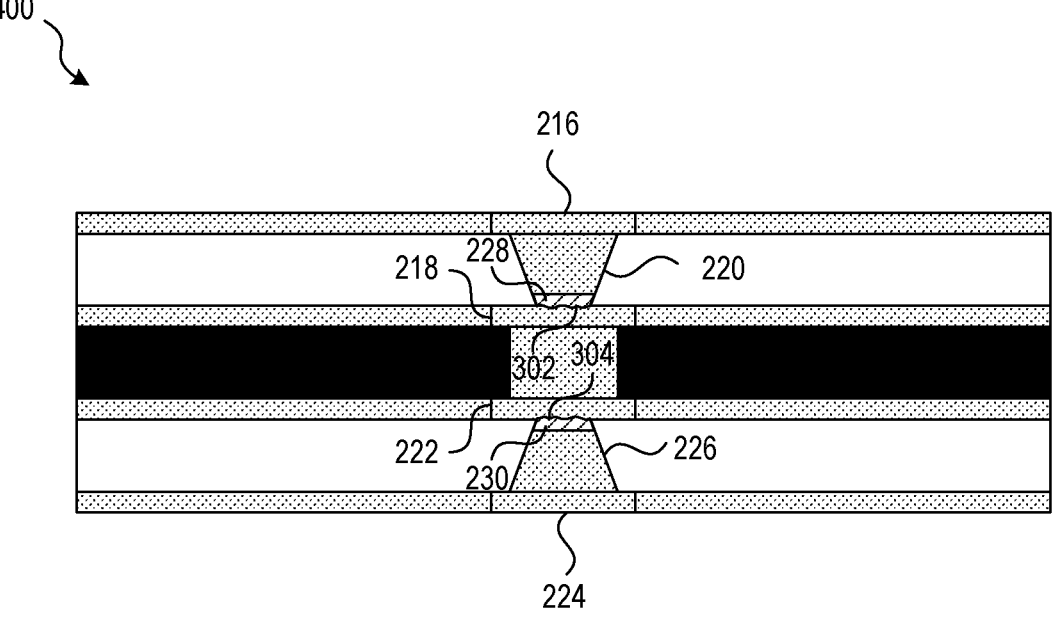
FIG. 4 illustrates a simplified schematic cross-sectional view of a substrate in accordance with an embodiment of the present technology.
Figure 5:
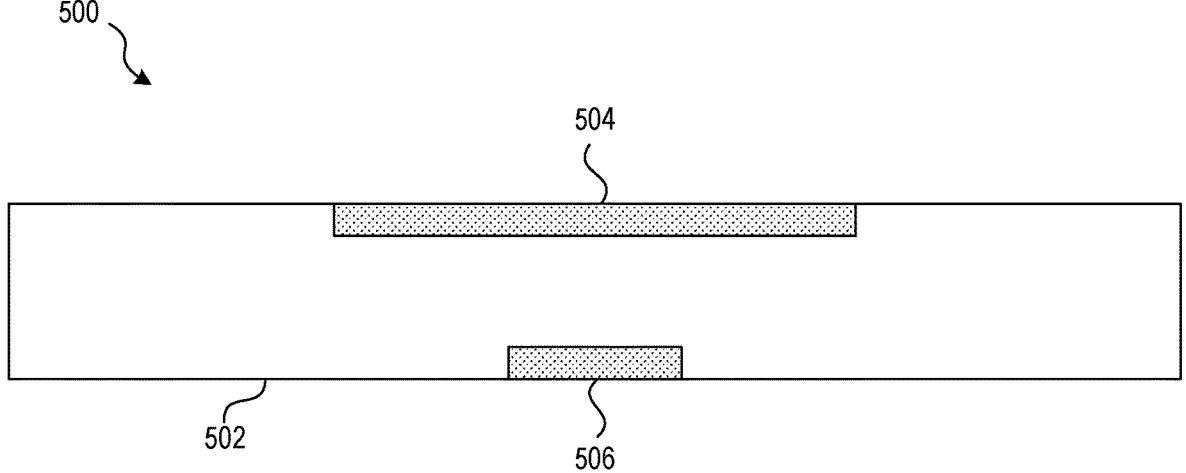
FIGS. 5-9 illustrate simplified schematic cross-sectional views of a series of steps for fabricating a substrate in accordance with an embodiment of the present technology.

As can be seen with reference to FIG. 4, a simplified schematic cross-sectional view of a substrate 400 is illustrated. The substrate 400 includes conductive material 228 and conductive material 230 that fills the crack 302 and the crack 304 between the vias and the respective contact. In this way, the conductive material may fill the voids created by the cracks and enable electrical signals to be reliably carried between the contact at a first layer and the contact at a second layer. Given that the heating temperature is not effective to melt the conductive material implementing the vias, the entire substrate 400 may be heated to melt the conductive material 228 and the conductive material 230 without damaging the substrate 400. As a result, the conductive material 228 and the conductive material 230 may fill the cracks, and the vias may electrically couple the contacts on each layer through the conductive material 228 and the conductive material 230.

FIGS. 5-9 illustrate simplified schematic cross-sectional views of a series of steps for fabricating a substrate in accordance with an embodiment of the present technology. Beginning with FIG. 5 at stage 500, a substrate 502 (e.g., a PCB) is provided. A first contact 504 is implemented at a first metallization layer of the substrate 502, and a second contact 506 is implemented at a second metallization layer of the substrate 502. The first contact 504 at the first metallization layer and the second contact 506 at the second metallization layer may be separated by a non-conductive material (e.g., PCB core, pre-preg, etc.). The first contact 504 or the second contact 506 may be any appropriate circuitry at which routing circuitry may couple. For example, the first contact 504 or the second contact 506 may include a trace or a contact pad. Although illustrated as a two-layer substrate, the substrate 502 may have any other number of layers, for example, three, four, five, ten, etc. Additionally, the first metallization layer or the second metallization layer may implement an external layer having contact pads that provide connectivity to one or more additional circuit components (e.g., a semiconductor die or a motherboard).

Figure 6:
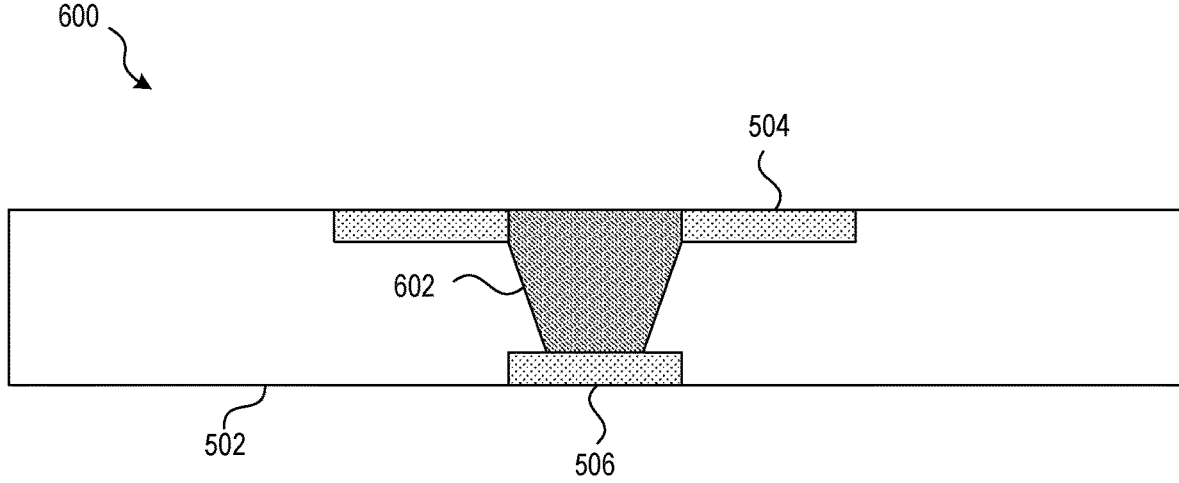

Turning to FIG. 6 at stage 600, an opening 602 is created through the non-conductive material between the first contact 504 and the second contact 506. For example, the opening 602 may extend through the substrate 502 to the second contact 506. In some implementations, the opening 602 may be created through the first contact 504. The opening 602 may be created through any number of appropriate techniques, for example, using mechanical drilling, laser drilling, etching, or chemical-mechanical planarization. In addition to creating the opening 602, the stage 600 may include treating the opening 602 with plasma to remove residual substrate material from the opening 602 and provide a clean surface for plating a via. As a result, conductive material plated to implement the via may resist cracking.

Figure 7:
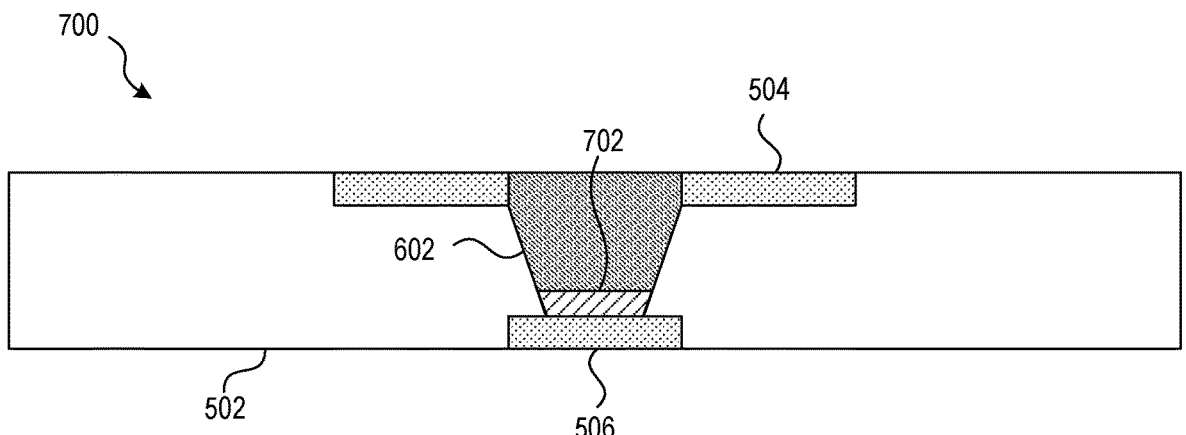

Turning to FIG. 7 at stage 700, conductive material 702 is disposed in the opening 602 at the second contact 506. The conductive material 702 may have a lower melting point than the conductive material used to implement the via, for example, between 100 and 150 degrees Celsius. The conductive material 702 may include any appropriate conductive material having a melting point less than the conductive material used to implement the via. For instance, the conductive material 702 may include solder. In some cases, the solder may be a low-temperature solder (e.g., having a melting point less than 150 degrees Celsius), for example, tin-bismuth solder, tin-indium solder, or indium-silver solder. The conductive material 702 may be disposed in the opening 602 through any appropriate technique. For example, solder paste may be deposited in the opening 602 and heated to evaporate flux within the solder paste and deposit solder at the second contact 506. The solder paste may be deposited in the openings 602 through any appropriate technique, including masking, screen printing, or dispensing. Alternatively or additionally, the conductive material 702 may be selectively deposited at the second contact 506.

The conductive material 702 may be disposed in any appropriate configuration. For example, the conductive material 702 may be disposed in the opening 602 at the second contact 506 as a continuous layer to completely cover the exposed portion of the second contact 506. Alternatively, the conductive material 702 may only partially cover the exposed portion of the second contact 506 to enable a via in the opening 602 to directly contact the second contact 506. For example, the conductive material 702 may implement an annulus that exposes the second contact 506 at the center. The annulus may be created by selectively depositing the conductive material 702 as an annulus. Alternatively, the conductive material 702 may be deposited in a continuous layer, and laser drilling or mechanical drilling may be used to remove a portion of the conductive material 702, expose the second contact 506, and create the annulus. The conductive material 702 may have any appropriate thickness. For example, the thickness of the conductive material 702 may be varied based on the size of crack the conductive material is intended to fill. Moreover, the thickness of the conductive material 702 need not be consistent at each location. Thus, the conductive material 702 may be disposed in the opening 602 in any number of configurations to enable a via crack to be filled.

Figure 8:
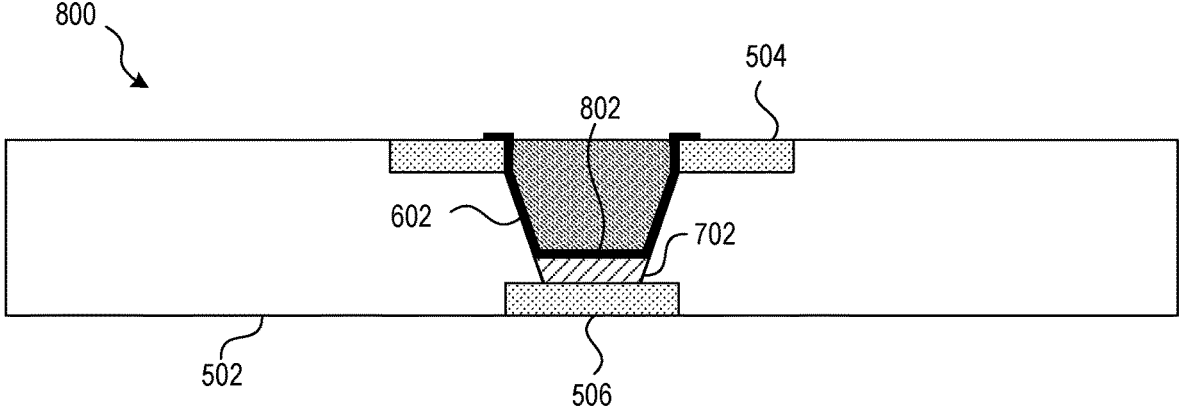

Turning next to FIG. 8 at stage 800, conductive material 802 may be plated in the opening 602 to implement a via that electrically couples the first contact 504 and the second contact 506. The conductive material 802 may be plated at the surfaces that define the opening 602. In aspects, the conductive material 802 may include copper (e.g., electroless copper). The conductive material 802 may have a melting point higher than a melting point of the conductive material 702 to enable the conductive material 802 to remain solid even when the conductive material 702 is melted. The conductive material 702 may be disposed at least partially between the conductive material 802 (e.g., which implements the via) and the second contact 506. In some instances, the conductive material 702 may be disposed over the entire portion of the second contact 506 that is exposed through the opening 602. Thus, the via may electrically couple the first contact 504 and the second contact 506 exclusively through the conductive material 702. Alternatively, the conductive material 702 may be disposed only partially between the conductive material 802 and the second contact 506 such that a portion of the conductive material 802, and thus the via, directly contacts the second contact 506. For example, the conductive material 702 may implement an annulus at the periphery of the via that exposes a portion of the second contact 506 at a center of the annulus, and the conductive material 802 may be disposed within the center of the annulus such that the conductive material 802 directly contacts the second contact 506. If a crack occurs that at least partially separates the conductive material 802 from the second contact 506, the conductive material 702 may be heated past the melting point to fill the crack and repair the via without damaging the substrate 502.

Figure 9:
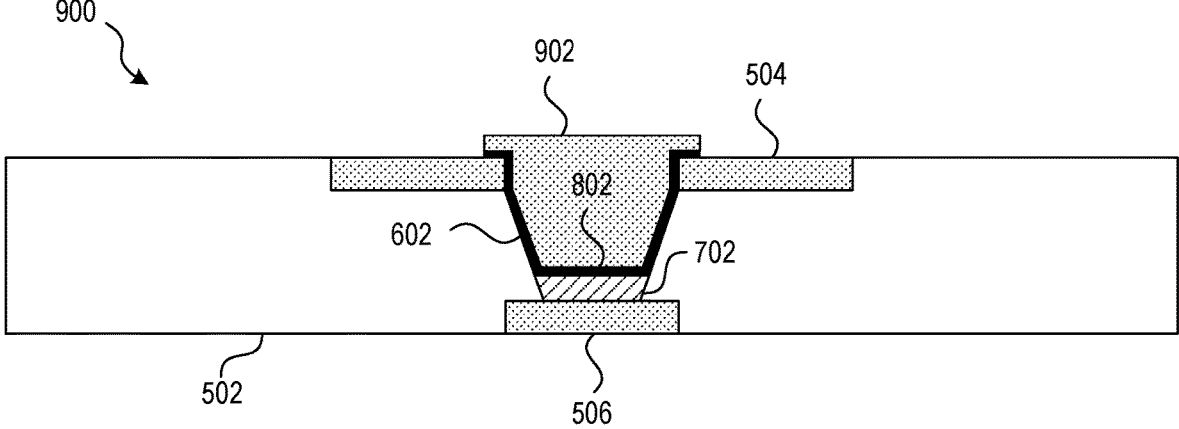

Turning next to FIG. 9 at stage 900, conductive material 902 may be disposed in the opening 602 to fill the opening 602 and implement a filled via. The conductive material 902 may include copper (e.g., electrolytic copper) that is deposited within the opening 602 above the conductive material 802. The via may couple the contact 504 to the second contact 506 such that electrical signals may be carried along the via. If the via cracks, for example, due to thermal cycling, the conductive material 702 (e.g., or the whole substrate 502) may be heated to a temperature effective to melt the conductive material 702 but not the conductive material 802 or the conductive material 902. As a result, the conductive material 702 may flow into and fill the crack to repair the substrate 502.

Figure 10:
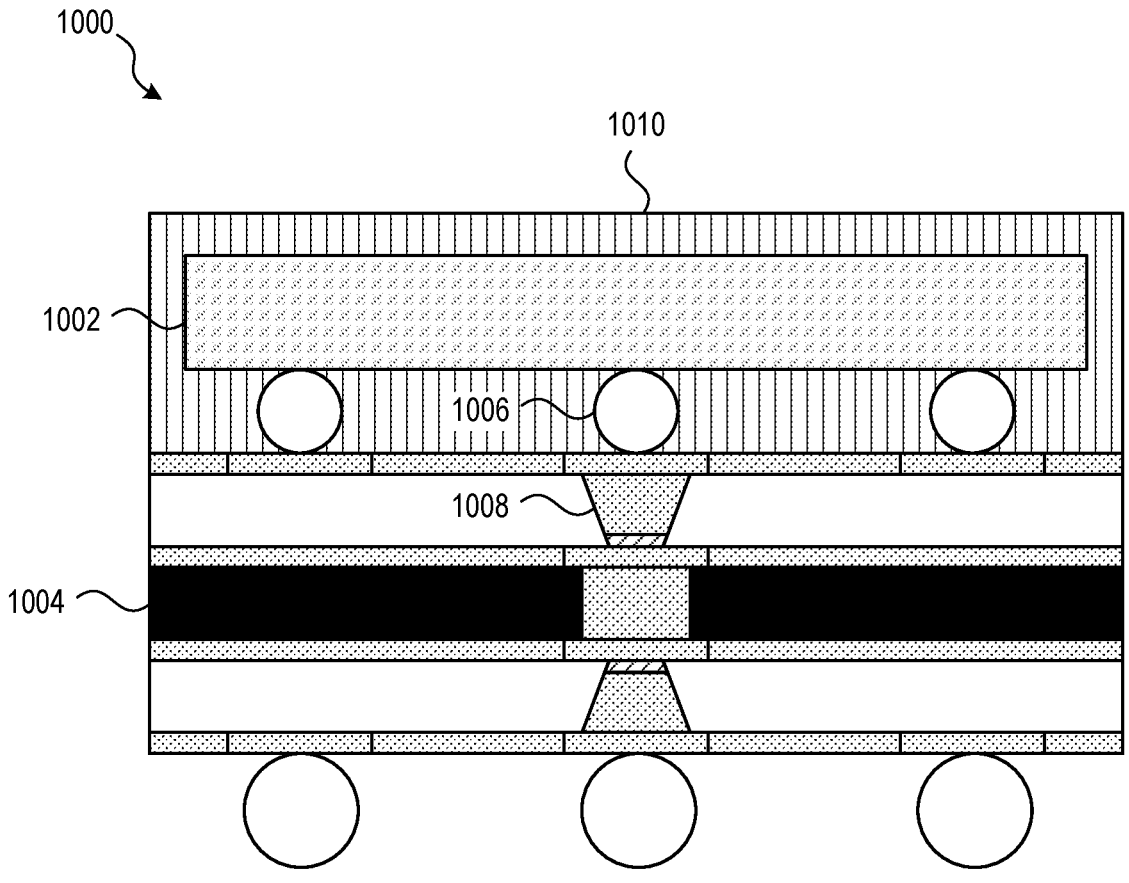
FIG. 10 illustrates a simplified schematic cross-sectional view of a semiconductor device assembly in accordance with an embodiment of the present technology.

Although the foregoing example substrates have been illustrated with a particular configuration, in other examples, substrates may be provided with a different configuration. Additionally, one or more circuit components may be assembled onto the substrate to create a packaged semiconductor device. One such semiconductor device assembly 1000 is illustrated in the simplified schematic cross-sectional view of FIG. 10. As can be seen with reference to FIG. 10, the semiconductor device assembly 1000 can include a semiconductor die 1002 assembled onto a substrate 1004 (e.g., in a flip-chip arrangement). Interconnects 1006 may be formed between the semiconductor die 1002 and the substrate 1004. The substrate 1004 may include contact pads at which the interconnects 1006 are implemented. The substrate 1004 can further include package-level contact pads that provide external connectivity (e.g., via solder balls) to the semiconductor die 1002 (e.g., power, ground, and I/O signals). The substrate 1004 includes traces, lines, vias 1008, and other electrical connection structures that electrically connect the package-level contact pads to contact pads at an upper surface of the substrate 1004. The vias 1008 may be implemented with a portion of conductive material to enable cracks in the vias 1008 to be filled without damaging the substrate 1004. The semiconductor die 1002 and the substrate 1004 may be at least partially encapsulated by an encapsulant 1010 to protect the semiconductor device from interferences (e.g., moisture, particulates, static electricity, and physical impact).

Although the foregoing example embodiment substrates have been illustrated and described as including a particular number of layers and having a particular configuration, in other embodiments, substrates can be provided with other configurations. For example, the substrates illustrated in any of the foregoing examples could be implemented with, e.g., a different number of layers, a different configuration of routing circuitry, or a different configuration of circuit components thereon, mutatis mutandis.

In accordance with one aspect of the present disclosure, the semiconductor devices illustrated in the foregoing examples could be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 11:
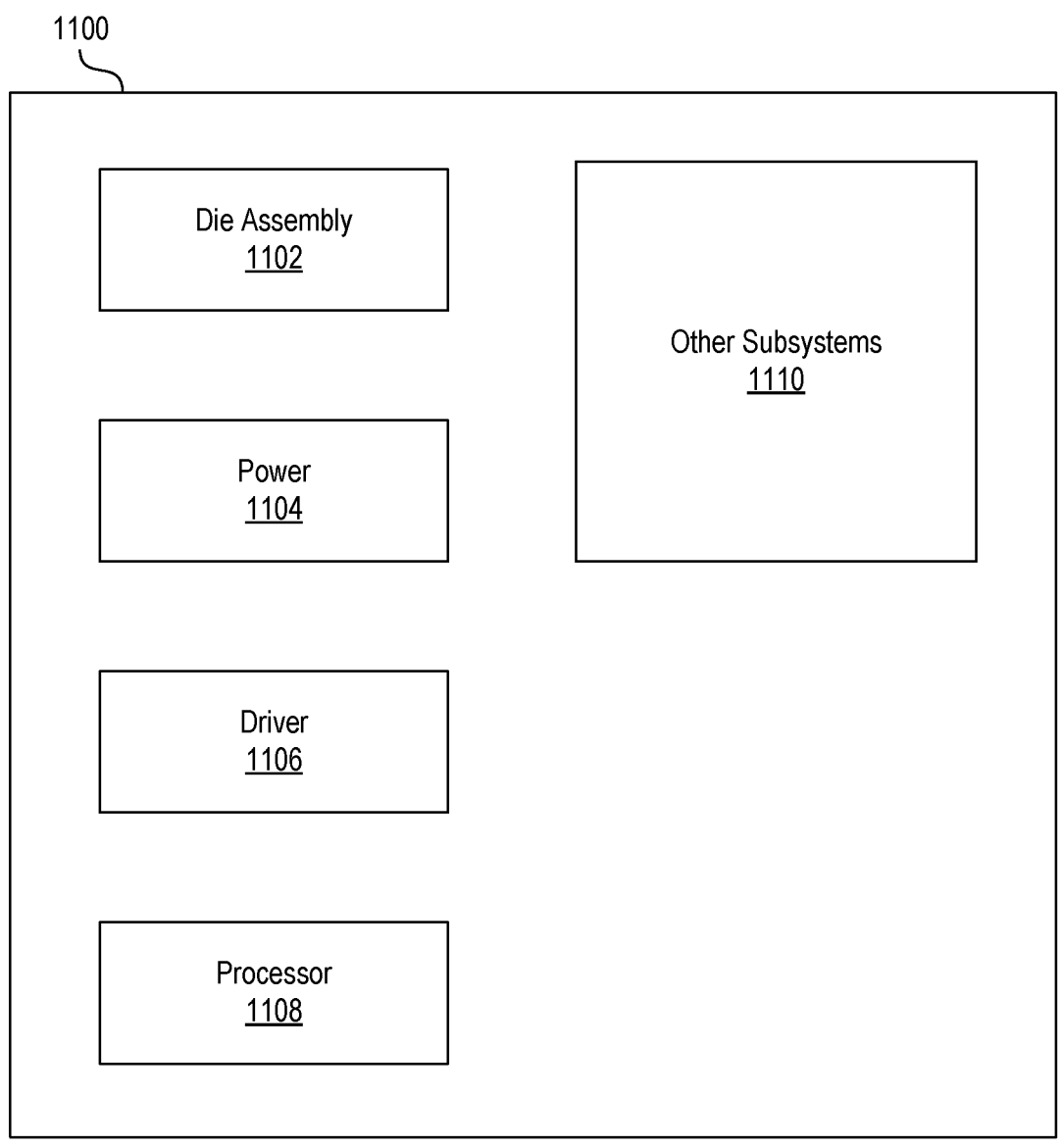
FIG. 11 illustrates a schematic view of a system that includes a semiconductor device assembly configured in accordance with an embodiment of the present technology.

Any one of the semiconductor devices or substrates described in the foregoing examples can be incorporated into any of a myriad of larger and/or more complex systems, a representative example of which is system 1100 shown schematically in FIG. 11. The system 1100 can include a semiconductor device assembly 1102 (e.g., or a discrete semiconductor device), a power source 1104, a driver 1106, a processor 1108, and/or other subsystems or components 1110. The semiconductor device assembly 1102 can include features generally similar to those described above with reference to FIGS. 2-10. The resulting system 1100 can perform any of a wide variety of functions, such as memory storage, data processing, and/or other suitable functions. Accordingly, representative systems 1100 can include, without limitation, hand-held devices (e.g., mobile phones, tablets, digital readers, and digital audio players), computers, vehicles, appliances and other products. Components of the system 1100 may be housed in a single unit or distributed over multiple, interconnected units (e.g., through a communications network). The components of the system 1100 can also include remote devices and any of a wide variety of computer readable media.

This disclosure now turns to various methods relating to filling cracks in substrate vias. The methods may, for illustrative purposes, be described with respect to features, components, or elements of FIGS. 2-11. Although illustrated in a particular configuration, one or more operations of the illustrated methods may be omitted, repeated, or reorganized. Additionally, the methods may include other operations that are not illustrated, for example, operations detailed in one or more other methods described herein.

FIG. 12 illustrates an example method 1200 for fabricating a substrate in accordance with an embodiment of the present technology. At 1202, a substrate 502 is provided. The substrate 502 may comprise a PCB. The substrate 502 may include a first layer having a first contact 504 and a second layer having a second contact 506. The first contact and the second contact may be separated by a layer of non-conductive material. At 1204, an opening 602 is created through the layer of non-conductive material and between the first contact 504 and the second contact 506. In some implementations, the opening 602 may be created using laser drilling or mechanical drilling.

At 1206, first conductive material 702 is disposed in the opening 602 at the second contact 506. The first conductive material 702 may be disposed at least partially between the second conductive material 802 and the second contact 506. The first conductive material 702 may have a first melting point. In some instances, the first conductive material 702 may include low-temperature solder (e.g., having a melting point between 100 and 150 degrees Celsius), for example, solder including 42 percent tin and 58 percent bismuth, 48 percent tin and 52 percent indium, or 97 percent indium and 3 percent silver. In aspects, disposing the first conductive material 702 may include disposing solder paste in the opening 602 and heating the solder paste effective to evaporate flux from the solder paste and deposit solder at the second contact 506. In some implementations, disposing the first conductive material 702 may include disposing a layer of the first conductive material 702 in the opening 602 at the second contact 506 and removing a portion of the layer of the first conductive material 702 (e.g., using laser drilling or mechanical drilling) effective to leave an annulus of the first conductive material 702.

At 1208, second conductive material 802 is disposed in the opening effective to electrically couple the first contact 504 and the second contact 506. The second conductive material 802 may have a second melting point that is higher than the melting point of the first conductive material 702. In aspects, the second conductive material 802 may include copper. The first conductive material 702 may be disposed only partially between the second conductive material 802 and the second contact 506 such that the second conductive material 802 directly contacts the second contact 506. In implementations when the first conductive material 702 implements an annulus, second conductive material 802 may be disposed within the annulus such that the second conductive material 802 directly contacts the second contact 506.

FIG. 13 illustrates an example method 1300 for repairing a substrate in accordance with an embodiment of the present technology. At 1302, a substrate 200 is provided that includes a first layer 208 having a first contact 216, a second layer 210 having a second contact 218, a via 220 electrically coupling the first contact 216 and the second contact 218, and a second conductive material 228 disposed at least partially between the via 220 and the second contact 218. The via 220 may include a first conductive material having a first melting point. The second conductive material 228 may have a second melting point that is lower than the first melting point. In aspects, a crack 302 may at least partially separate the via 220 and the second contact 218. At 1304, the second conductive material 228 may be heated to a temperature that is higher than the second melting point but lower than the first melting point. In aspects, the heating may be effective to fill the crack 302 with the second conductive material 228. In some cases, heating the second conductive material 228 may include heating the substrate 200 (e.g., by oven baking) to the temperature. Given that the temperature is not effective to melt the via 220, the crack 302 may be filled and the via 220 may be repaired without damaging the substrate 200.

Specific details of several embodiments of semiconductor devices, and associated systems and methods, are described above. Depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer or a PCB. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of fabricating a via in a substrate, comprising:
providing the substrate including a first layer having a first contact and a second layer having a second contact separated by a layer of non-conductive material;
creating an opening at least through the layer of non-conductive material and between the first contact and the second contact;
disposing a first conductive material in the opening on the second contact, the first conductive material having a first melting point;
disposing a second conductive material in the opening on the first conductive material such that the first conductive material is disposed at least partially between the second conductive material and the second contact effective to implement a via that electrically couples the first contact and the second contact, the second conductive material having a second melting point higher than the first melting point; and
heating the first conductive material to a temperature that is higher than the first melting point but lower than the second melting point to melt the first conductive material disposed at least partially between the second conductive material and the second contact.

2. The method of claim 1, wherein the first conductive material comprises solder.

3. The method of claim 2, wherein the solder comprises at least one of:
tin and bismuth;
tin and indium; or
indium and silver.

4. The method of claim 1, wherein disposing the first conductive material in the opening includes:
disposing solder paste in the opening; and
heating the solder paste effective to evaporate flux from the solder paste and deposit solder at the second contact.

5. The method of claim 1, wherein disposing the first conductive material in the opening includes disposing the first conductive material only partially between the second conductive material and the second contact such that a portion of the second conductive material directly contacts the second contact.

6. The method of claim 1, wherein:
disposing the first conductive material in the opening includes:
disposing a layer of the first conductive material in the opening at the second contact; and
removing a portion of the layer of the first conductive material effective to leave an annulus of the first conductive material; and
disposing the second conductive material includes disposing the second conductive material at least within the annulus of the first conductive material and contacting the second contact.

7. The method of claim 6, wherein removing the portion of the layer of the first conductive material includes using laser drilling or mechanical drilling.

8. The method of claim 1, wherein the substrate comprises a printed circuit board.

9. A method of repairing a substrate, comprising:
providing the substrate including:
a first layer having a first contact;
a second layer having a second contact;
a via electrically coupling the first contact and the second contact, the via including (i) a first conductive material disposed on the second contact and having a first melting point and a second conductive material disposed on the first conductive material such that the first conductive material is disposed at least partially between the second conductive material and the second contact, the second conductive material having a second melting point that is higher than the first melting point, wherein the via is at least partially separated from the second contact by a crack; and
heating the first conductive material to a temperature that is higher than the first melting point but lower than the second melting point to melt the first conductive material disposed at least partially between the second conductive material and the second contact, the heating effective to fill the crack with the first conductive material.

10. The method of claim 9, wherein heating the first conductive material to the temperature comprises heating the substrate to the temperature.

\* \* \* \* \*